United States Patent [19]

Kim et al.

[11] Patent Number: 4,874,712
[45] Date of Patent: Oct. 17, 1989

[54] FABRICATION METHOD OF BIPOLAR TRANSISTOR

[75] Inventors: Myung S. Kim, Seoul; Hyun S. Kang, Suweon; Soon K. Lim; Hee K. Park, both of Bucheon, all of Rep. of Korea

[73] Assignee: Samsung Semiconductor & Telecommunication Co., Ltd., Gumi City, Rep. of Korea

[21] Appl. No.: 249,401

[22] Filed: Sep. 26, 1988

[30] Foreign Application Priority Data

Sep. 26, 1987 [KR] Rep. of Korea .................... 87-10713

[51] Int. Cl.[4] ......................................... H01L 21/225
[52] U.S. Cl. ...................................... 437/31; 437/32; 57/35; 14/DIG. 10
[58] Field of Search .................... 437/31, 32, 909, 915, 437/917, 162, 97; 148/DIG. 10, DIG. 11; 357/59, 35

[56] References Cited

U.S. PATENT DOCUMENTS

| | | | |
|---|---|---|---|
| 4,125,426 | 11/1978 | Inayoshi et al. | 437/162 |
| 4,295,898 | 10/1981 | Yoshida et al. | 437/31 |
| 4,375,999 | 3/1983 | Nawata et al. | 437/162 |
| 4,483,738 | 11/1984 | Blossfeld | 437/31 |
| 4,581,319 | 4/1986 | Wieder et al. | 437/31 |

FOREIGN PATENT DOCUMENTS

| | | | |
|---|---|---|---|
| 0071665 | 2/1983 | European Pat. Off. | 437/31 |
| 2179792 | 3/1987 | United Kingdom | 437/162 |

Primary Examiner—Brian E. Hearn
Assistant Examiner—Tuan Nguyen
Attorney, Agent, or Firm—Cushman, Darby & Cushman

[57] ABSTRACT

Present invention relates to the fabrication method of the bipolar transistor.

With this method the emitter of high-concentrated n-type is contacted closely to the extrinsic base of high-concentrated p-type.

This structure is obtained by making the emitter of the bipolar transistor be self- aligned by the side wall undercut of the nitride layer using double layers of the low temperature oxide and the nitride layer.

2 Claims, 7 Drawing Sheets

FABRICATION METHOD OF BIPOLAR TRANSISTOR

BACKGROUND OF THE INVENTION

1. Field of the Invention

The present invention is related to the fabrication method of the semeconductor devices, and is related especially to the improved fabrication of the semiconductor devices which form the high-speed, high-integration bipolar transistors by a simple fabrication process of the self-aligned emitter and the base region.

2. Description of the Prior Art

The resistance of the base region, Rb, has to be reduced to enhance the operation speed and the immunity properties from noise of the general bipolar transistor.

The base resistance, Rb, is made up with the resistance R1 of the active base region (or the intrinsic base) under the emitter region and the resistance R2 of the bulk base region from the contact region of the edge part of the emitter region and the bulk base region (or extrinsic base) in a common bipolar transistor.

It is difficult to change the resistance R1 because the area of the intrinsic base region is related closely to the properties of the transistor such as the cutoff frequency, the current gain, etc.

Accordingly, if we intend to reduce the base resistance Rb, the resistance R2 of the bulk base region has to be reduced.

FIG. 1 shows the schematic cross sectional view of the NPN bipolar transistor having the structure that impurities of high-concentration are diffused to the bulk base region to reduce the resistance of the base region.

In FIG. 1, the collector region C is the n-type epitaxial layer formed on the p-type single-crystal silicon substrate, and the base region B the p-type diffusion layer, and the emitter region E the high-concentration n-type diffusion layer.

The insulator film 01 is formed on the substrate in which the collector, the base and the emitter are formed, and each metal electrode 02, 03 and 04 is formed on a part of each region of the emitter E, the base B and the collector C.

The base region B is made up with the p-type region a, the active base region under the emitter, and the region b, the bulk base region of the high-concentration p diffusion layer, and the resistance $R_1$ of the region a having a high resistance and the resistance $R_2$ of the region b having a low resistance.

In FIG. 1, the overall base resistance Rb, which is the sum of the resistance R1 and the resistance R2 connected in series, is reduced by reducing the resistance R2 by means of the diffusion of the high-concentration p impurities to the bulk base region b as mentioned before.

When the region a and the region b are formed as above, they are formed by the double ion-implantation process, where it is desirable that the region b should be as close to the emitter region as possible, but not be overlapped.

If the region b is far from the emitter region E, the resistance R1 is to be increased by the extending of the region a.

Also if the region b becomes close and overlapped with the emitter region E, it is degenerated and the leakage current increases and the noise properties become degraded.

The self-align method was applied so that the region b may be as close to the emitter region as possible but may not bring about the degradation phenomenon.

However, there were some disadvantages in this method in the reproducibility of the properties of the NPN transistor because many kinds of complicated processes had to be passed through.

In the mean time, a special equipment which can grow a thick oxide layer without side oxide growing under low temperature is needed to fabricate the NPN transistor which has the shallow emitter width of the desired structure and does not deteriorate the properties.

SUMMARY OF THE INVENTION

Accordingly, the purpose of the present invention is to provide the improved fabrication method of the bipolar transistor using the self-align method in which the high-concentration region of the base and the emitter are formed as close to each other as possible not in the state of degeneration by a simple fabrication process without using a special equipment.

DETAILED DESCRIPTION OF THE INVENTION

Hereafter the present invention is described in detail with figures appended.

FIGS. 2A to M are the fabrication process diagrams of an example according to the present invention.

The starting material of the substrate is the p-type single-crystal silicon wafer whose resistivity is 10 to 20Ω-cm and crystal plane is (100).

Figure 1:
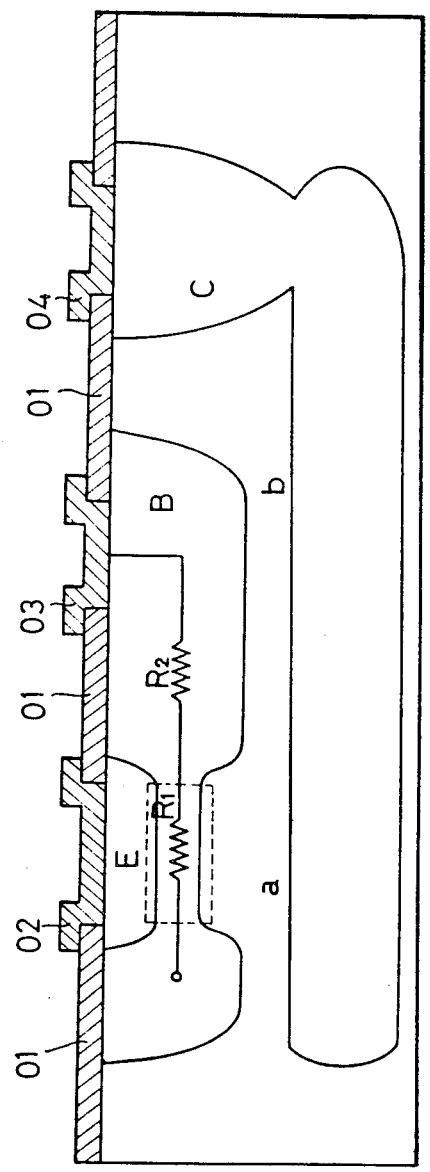
FIG. 1 is the schematic partial cross sectional view of the traditional NPN bipolar transistor.
Figure 2A:
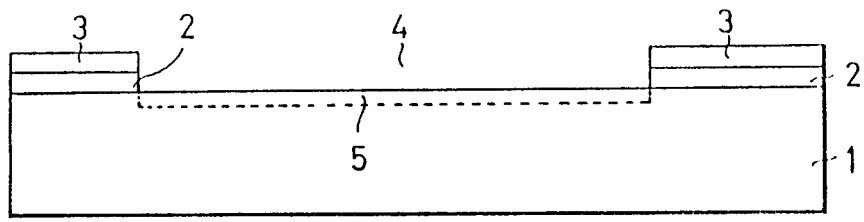
FIGS. 2A to M are the fabrication process diagrams according to the present invention.
Figure 2B:
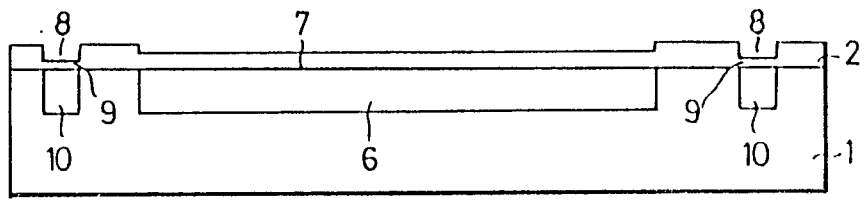

As shown in FIG. 2A, the 1st silicon oxide layer 2 of 6000 to 8000 Å for the masking is grown on the substrate 1 by the conventional oxidation process, and then the photoresist 3 is put on to cover the upper surface of the oxide 2, and then window 4 to form the buried layer of the NPN transistor is formed by the conventional photolithographic process, and then the photoresist is removed and Arsenic ions whose dose is $5 \times 10$ to $8 \times 10^{15}$ ions/cm$^2$ with the proper energy to form the n-type ion-implanted region 5 are implanted.

And then, the n-type ion-implanted region mentioned before is activated at 1150° to 1200° C. for about 2 to 4 hours to form the high-concentration n-type semiconductor region 6.

At that time, the oxide layer 7 is grown on the surface of the ion-implanted region by the conventional oxidation process.

The window 8 for the device separation of the n-type semiconductor region 6 is formed around the n-type semiconductor region 6 by the conventional photolithographic process, the photoresist is removed and the thin 2nd oxide layer 9 is grown on the whole surface of the substrate by a common oxidation process.

And then, after boron ions are implanted through the window region in the state of the proper energy and dose, the ion-implanted impurity ions are activated to form the 1st p-type semiconductor region 10 by the conventional process.

Figure 2C:
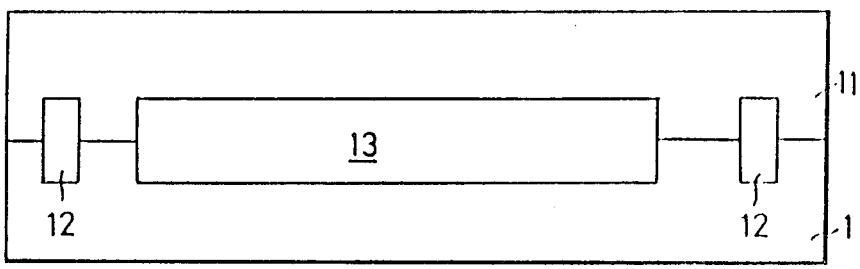

And then, the oxide on the surface of the substrate is completely removed, and the n-type epitaxial layer 11 is grown on the substrate as shown in FIG. 2C.

The n-type buried layer 13 and the p-type 1st device separation region 12 extended over the substrante 1 and the epitaxial layer 11 are grown by the activation of the n-type semiconductor region 6 and the p-type semiconductor region 10 during the epitaxial layer 11 is grown.

Figure 2D:
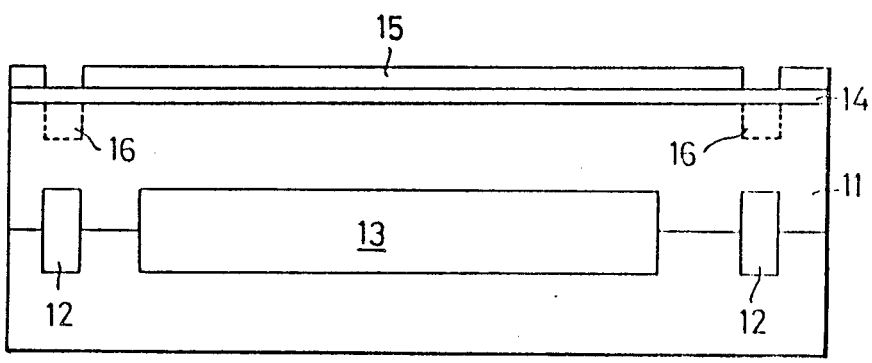

And then, after the 3rd oxide layer 14 is grown on the epitaxial layer by the conventional oxidation process as in FIG. 2D and the photomask 15 is formed by the conventional photolitograpic process to form the 2nd device separation region, boron ions whose dose is about $3 \times 10^{15}$ to $5 \times 10^{15}$ with the proper energy to form the 2nd p-type ion-implanted region 16 are implanted.

Figure 2E:
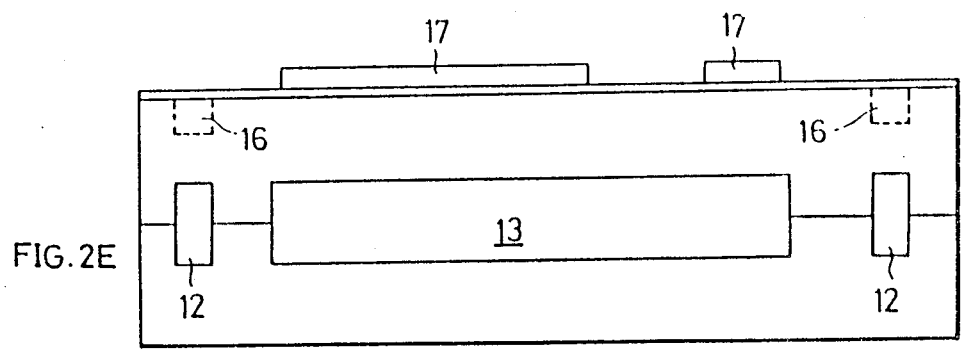
Figure 2F:
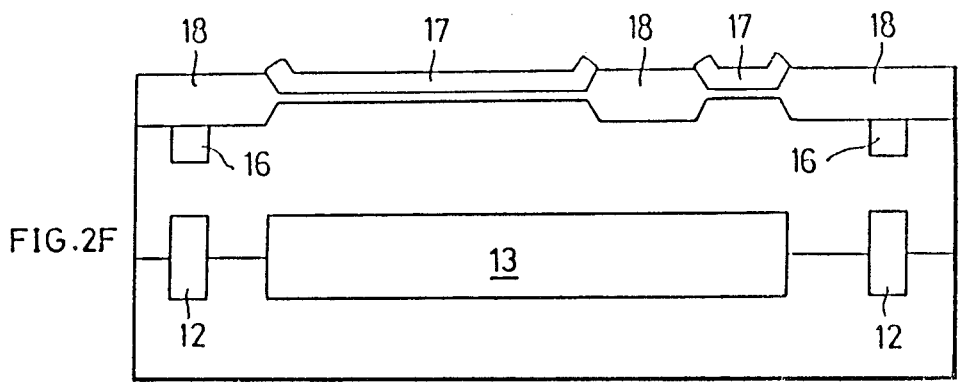

And then, after the photomask 15 is removed and the 1st nitride layer 17, $Si_3N_4$, of 1000 to 2000 Å is formed on the substrate by the conventional CVD (Chemical Vapor Deposition) process, the photoresist is put on the 1st nitride and so the 1st nitride layer 17 of the remaining part except the part, where the active region of the device is to be formed, is etched by the conventional photolithographic process as shown in FIG. 2E.

In order to form the field region the 4th oxide layer 18 of 8000 to 10000 Å is grown on the 3rd oxide layer exposed by the removal of the 1st nitride layer in the above-mentioned process by the conventional oxidation process.

At that time, the 3rd oxide layer under the nitride layer is not grown due to the mask effect of the 1st nitride layer.

And then, after the 1st nitride layer 17 and the oxide layer 14 under the 1st nitride layer are removed by the conventional process, the 5th oxide layer 19 is grown by the conventional oxidation process.

Figure 2G:
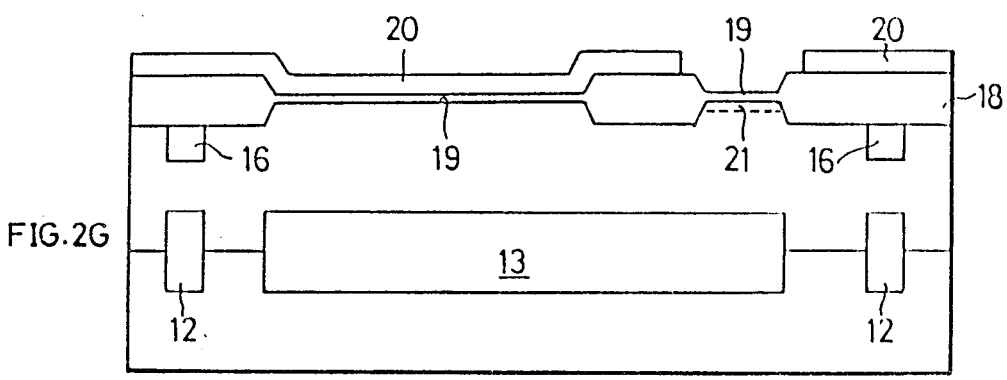
Figure 2H:
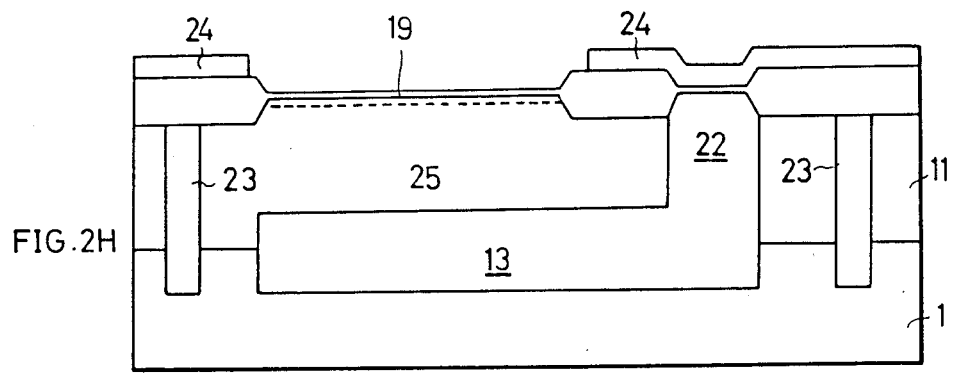

And the photomask 20 is formed to form the n+ sink region and the phosphorus ions whose dose is about $9 \times 10^{14}$ to $3 \times 10^{15}$ ions/cm$^2$ with the proper energy to form the n-type ion-implanted region 21 as in FIG. 2G are implanted.

And then, the n-type ion-implanted region 21 for the formation of the n+ sink is activated by the conventional process in order to connect the n-type sink region 22 with the n-type buried layer 13.

At that time, the 1st and the 2nd device separation regions 12 and 16 are also activated to form a device separation region 23.

In the mean time, if it is needed that the NPN transistior with the polycrystalline silicon resistor on the same substrate should be formed, the formation process of the polystalline silicon resistor is added and then the next process is proceeded.

After the device separation region and the sink region are formed as above, the photomask 24 is formed to form the intrinsic base of the NPN transistor and then boron ions whose dose is about $3 \times 10^3$ to $7 \times 10^{13}$ ions/cm$^2$ with the proper energy to form the intrinsic base region 25 are implanted.

Figure 2I:
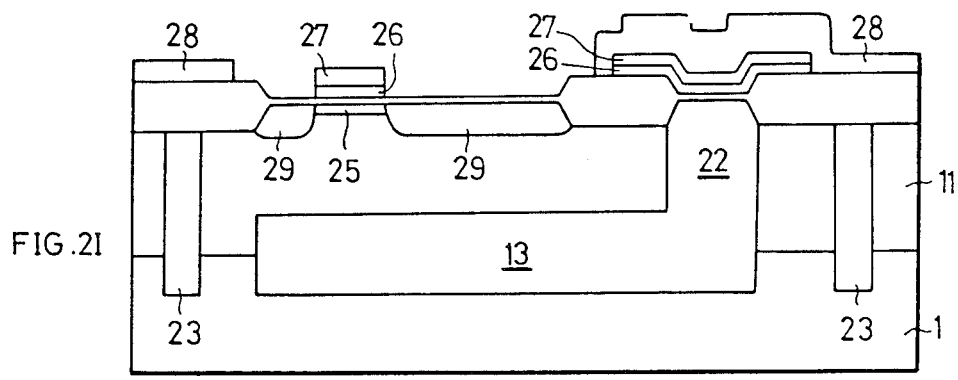
Figure 2I:
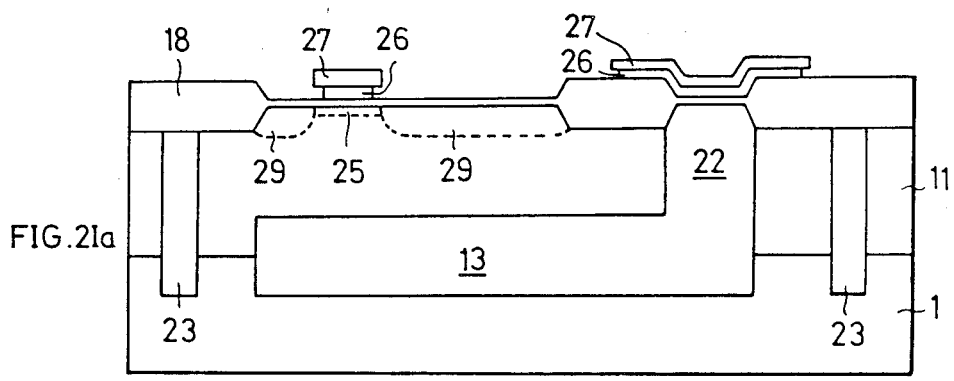
Figure 2I:
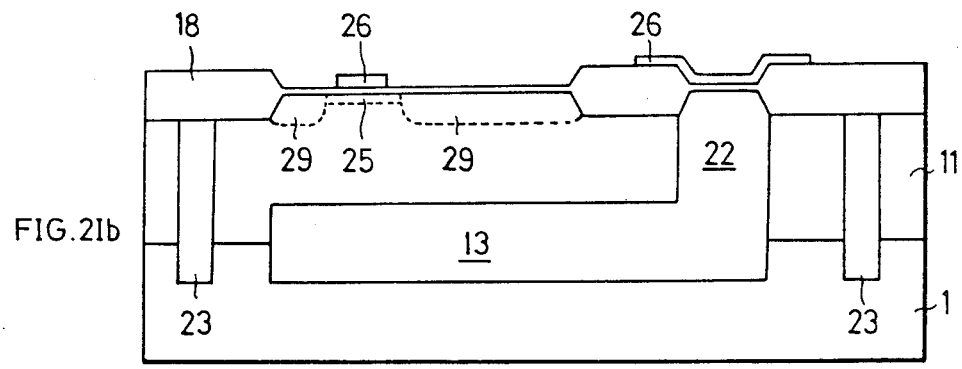
Figure 2I:
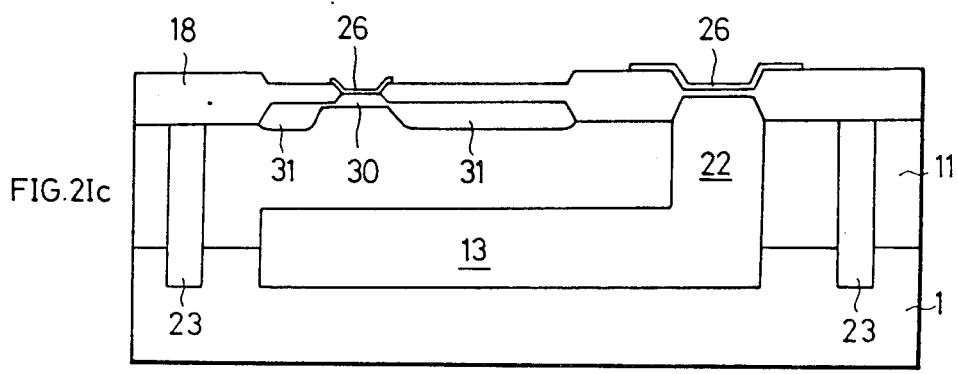

After removing photomask 24 and 2nd nitride layer 26, $Si_3N_4$ is deposited on the substrate by the conventional process and then the 6th low temperature oxide layer 27 is deposited on the 2nd nitride layer, the densification is proceeded to increase the density of the 6th low temperature oxide layer 27 as in FIG. 2I.

And then, except for the region where the emitter is to be formed, the remaining region is etched out by the conventional photolithographic process to form the emitter region, and the photomask 28 is formed to form the 2nd base (extrinsic base), and then boron ions whose dose is about $5 \times 10^{-}$ to $9 \times 10^{14}$ ions/cm$^2$ with the proper energy to form the 2nd base ion-implanted region 29 as in FIG. 2I are implanted.

And then, after removing the photomask 28, the 2nd nitride layer is etched in the phosphoric acid solution of 120° to 180° C. for 1 to 3 hours in order to etch the side walls of the 2nd nitride layer, as in FIG. 2I-a.

The purpose of the undercut of the 2nd nitride layer is to prevent the direct contact of the high-concentration boron region of the 2nd base (extrinsic base) side with n-type the emitter region to be formed later.

And then, after the 6th low temperature oxide layer 27 is removed as in FIG. 2 I-b and the ion-implanted base regions 25 and 29 are annealed to form the 1st and the 2nd base regions 30 and 31, the 7th oxide layer 32 is grown by the conventional oxidation process as in FIG. 2I-c.

Figure 2J:
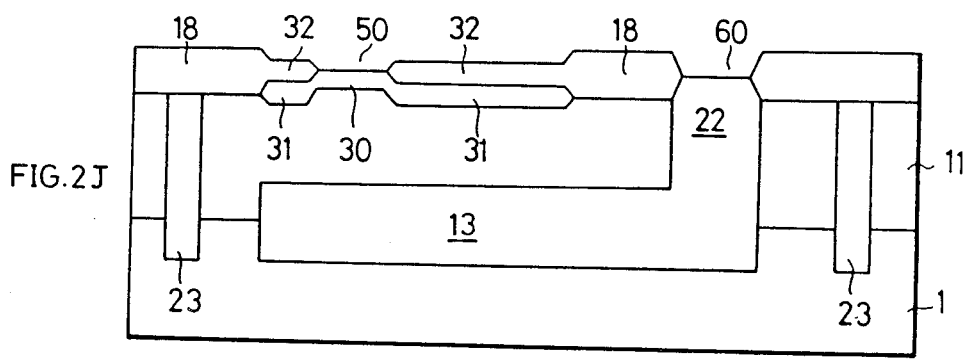
Figure 2J:
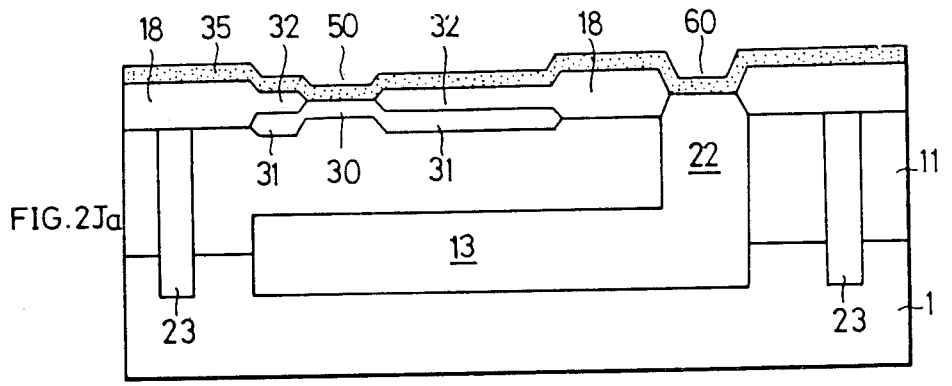

And then, the 2nd nitride layer 26 is removed, and also the oxide layers of the region 50, where the emitter is to be formed on the upper surface of the 1st base region, and the collector contact region 60 of the NPN transistor are removed to be formed as in FIG. 2J.

At that time, the part where the second nitride was becomes the emitter contact.

And then, after the polycrystalline silicon layer of 1500 to 3000 Å is formed on the whole surface of the substrate by the conventional LPCVD (Low Pressure Chemical Vapor Deposition) process and arsenic ions whose does is about $4 \times 10^{15}$ to $9 \times 10^{15}$ ions/cm$^2$ with the proper energy are implanted, the annealing is preceeded in $N_2$ ambient of about 1000° to 1050° C. for 30 to 50 minutes.

By this step, arsenic ions in the polycrystalline silicon are diffused into the 1st base region 30 and the n+ sink region 22 through the regions 50 and 60, forming diffused emitter and collector regions 33 and 34 as in FIG. 2J-a.

Figure 2K:
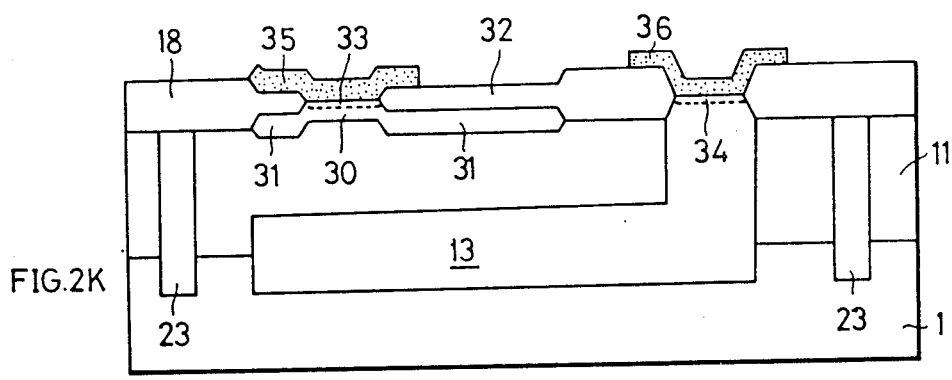

And then, the polycrystalline silicon layer is formed by the conventional photolithographic process as in FIG. 2K to form the polycrystalline silicon emitter contact 35 and the polycrystalline silicon collector contact 36.

After the 8th low temperature oxide layer 37 of 3000 to 4000 Å is deposited over the entire structure the conventional process and annealing is proceeded to form the emitter region 38.

Figure 2L:
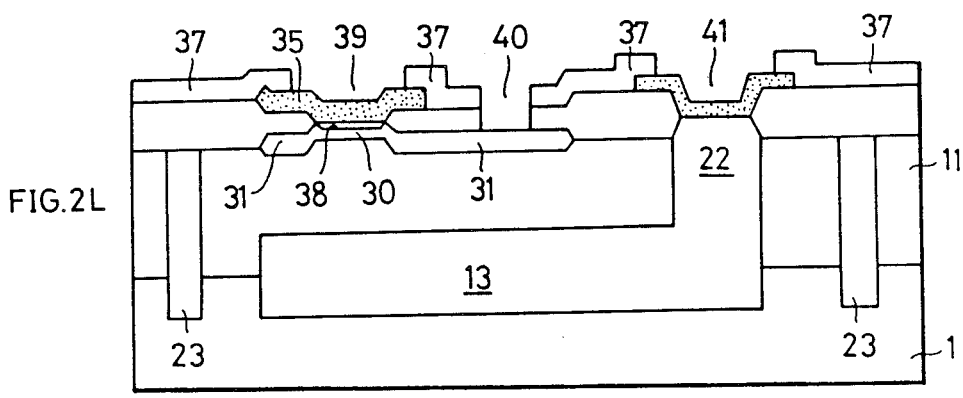
Figure 2M:
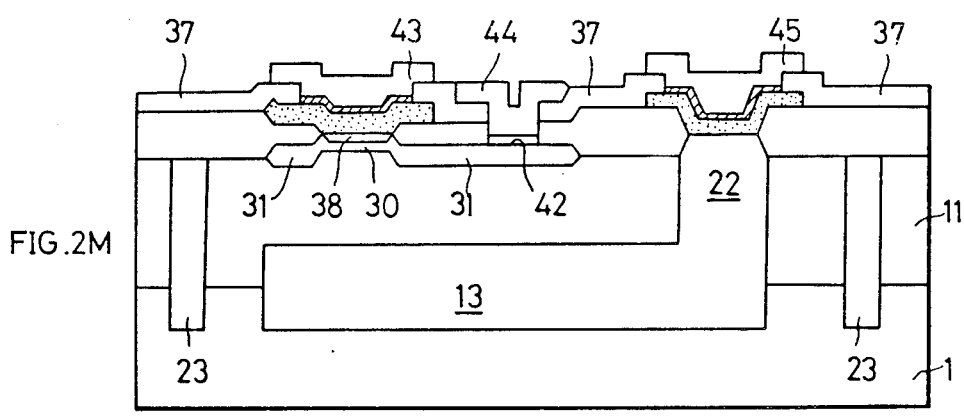

The contact windows 39, 40 and 41 for electrical connection of the emitter, the base and the collector are opened as in FIG. 2L.

A metalization layers 43,44,45 are added to the device to establish electrical connections to the emitter, base and collector regions.

As mentioned above, the main feature of the present invention is self-aligned technology by the undercut of nitride layer using the double layer of nitride and oxide layer.

The distandce between emitter and extrinsic base region is controlled by the amount of the undercut.

And so, it is easy to fabricate the NPN transistor with 1 μm wide emitter, and there is no damage induced by RIE (reactive ion etch) in intrinsic base region compared with the conventional self-aligned technology.

Also the present invention can make the operation speed faster than that of traditional one by reducing the base resistance because the distance between the emitter and the extrinsic base can be designed closer by making the emitter and the base be self-aligned in the present invention than the traditional method which proceeds an additional alignment.

Also the linearity of the D.C. current gain $h_{FE}$ of the present invention becomes very excellent by using a doped polycrystalline silicon as the emitter diffusion source. Also the present invention has the advantage that the operation speed of the device can be improved by the thing that the shallow base junction is available without any influence of the premature punch through because the D.C current gain $h_{FE}$ of the bipolar transistor with polycrystalline emitter to 4 times larger than that of the bipolar transistor with metal contact emitter, and accordingly the concentration of the base can be increased when the D.C current gain $h_{FE}$ of the same level is required.

I claim:

1. The fabrication method of the bipolar transistor characterized by the thing that the formation method of the base and the emitter region is made up with the process mentioned below in the fabrication method of the bipolar transistor which is fully equipped with the collector region of the 1st conduction type on the silicon substrate of the 1st conduction type and the base region of the 2nd conduction type in the collector region and the emitter region of the 1st conduction type in the base region:
   a. the process in which ions of the 2nd conduction type are implanted into the region where the said base is to be formed to form the 1st base region,
   b. the process in which the nitride layer and the oxide layer for the masking are formed sequentially on the surface of the substrate, and the oxide and the nitride layer of the remaining region except for the region, where the emitter is to be formed, are etched to form the masking layer,
   c. the process in which ions of the 2nd conduction type are implanted into the region, where the base is to be formed, with the higher dose than that of the ion implantation of the said process by using the masking layer of the region, where the said emitter is to be formed, as the mask to form the 2nd base region,
   d. the process in which the side walls of the nitride layer for the masking are etched to define the emitter region,
   e. the process in which, after the oxide layer for the masking is removed and the annealing is proceeded to activate the ion-implanted region in the process c, a specified oxide layer is formed by using the nitride layer as the mask,
   f. the process in which the nitride layer is removed and the window is formed on the region, where the emitter is to be formed, and the collector contact region,
   g. the process in which the polycrystalline silicon layer is formed on the surface of the substrate and ions of the 1st conduction type are implanted into the polycrystalline silicon layer,
   h. the process in which the doped polycrystalline silicon layer is etched to form the polycrystalline silicon emitter contact and the polycrystalline silicon collector contact,
   i. the process in which the oxide layer, which is the protection layer, is formed on the surface of the substrate and the heat treatment for the formation of the emitter region is proceeded,
   j. the process in which the window is formed for the electrode contacts of the emitter, the base and the collector region,
   k. and the process in which metal is connected to the conductor layer through the window.

2. In the claim 1, the method characterized by the thing that the silicon layer is formed on the contact window region after the process step j.

* * * * *